(12) United States Patent
Sasaki et al.

(10) Patent No.: US 10,609,831 B2
(45) Date of Patent: Mar. 31, 2020

(54) CIRCUIT UNIT, ELECTRICAL JUNCTION BOX, AND PRODUCTION METHOD OF CIRCUIT UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi (JP)

(72) Inventors: Yoshikazu Sasaki, Mie (JP); Jun Ikeda, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/433,120

(22) Filed: Jun. 6, 2019

(65) Prior Publication Data
US 2019/0380214 A1 Dec. 12, 2019

(30) Foreign Application Priority Data
Jun. 7, 2018 (JP) ................... 2018-109233

(51) Int. Cl.
 *H05K 5/00* (2006.01)
 *H05K 5/02* (2006.01)
 *H05K 7/20* (2006.01)
(52) U.S. Cl.
 CPC ......... *H05K 5/0056* (2013.01); *H05K 5/0247* (2013.01); *H05K 7/20409* (2013.01)
(58) Field of Classification Search
 CPC ............... H01R 9/226; H01R 13/5216; H01R 13/5227; H02G 3/088; H05K 5/0056; H05K 5/0247; H05K 5/00; H05K 5/02; H05K 7/20409; H05K 7/20; Y10S 248/906
 USPC ................................................... 174/549, 50
 See application file for complete search history.

(56) References Cited

U.S. PATENT DOCUMENTS

| | | | | |
|---|---|---|---|---|
| 6,155,006 | A * | 12/2000 | Mimura | E04D 1/365 52/173.3 |
| 2007/0049090 | A1 * | 3/2007 | Kaneko | B60R 16/0239 439/271 |
| 2008/0223597 | A1 * | 9/2008 | Kanou | H02G 3/088 174/50 |
| 2010/0271763 | A1 * | 10/2010 | Kodama | H02G 3/32 361/679.01 |

FOREIGN PATENT DOCUMENTS

JP 2004-031416 A 1/2004

* cited by examiner

*Primary Examiner* — Timothy J Thompson
*Assistant Examiner* — Guillermo J Egoavil
(74) *Attorney, Agent, or Firm* — Honigman LLP

(57) ABSTRACT

Entry of water from the terminal portion side to the electronic component side is inhibited. A circuit unit includes: a circuit section including a terminal portion that can be connected to an external terminal, and a body portion to which an electronic component is mounted; a first waterproofing portion that is in intimate contact with a portion to be waterproofed located between the body portion and the terminal portion of the circuit section, and that includes a resin containing an adhesive component; and a second waterproofing portion that is in intimate contact with an outer surface of each of the circuit section and the first waterproofing portion, and that is made of a resin.

14 Claims, 11 Drawing Sheets

CIRCUIT UNIT, ELECTRICAL JUNCTION BOX, AND PRODUCTION METHOD OF CIRCUIT UNIT

CROSS-REFERENCE TO RELATED APPLICATIONS

This application claims priority of Japanese Patent Application No. JP 2018-109233 filed on Jun. 7, 2018, the contents of which are incorporated herein.

TECHNICAL FIELD

The present specification discloses a technique for inhibiting entry of water into a circuit.

BACKGROUND

Conventionally, techniques for waterproofing the interior of a unit in which a circuit is accommodated are known. According to the technique described in JP 2004-31416A, a power circuit section disposed on a heat dissipation member via an insulating layer is covered by a waterproof case, and the waterproof case is provided with a hood for each connector for connection to the outside. A waterproofing portion filled with an epoxy resin is formed around the external connection terminal inside the hood, and the waterproofing portion prevents water from entering the waterproof case along the external connection terminal.

SUMMARY

Although the waterproofing portion is provided around the external connection terminal inside the hood portion in the configuration of JP 2004-31416A described above, a portion around a busbar, which is formed continuously with the external connection terminal, inside the waterproof case is not covered by the waterproof structure. Accordingly, there is concern that water may enter the inside of the waterproof case from the interface between the external connection terminal and the waterproofing portion.

The technique described in the present specification has been completed in view of the above-described circumstances, and an object thereof is to inhibit entry of water from the terminal portion side to the electronic component side.

A circuit unit described in the present specification includes: a circuit section including a terminal portion that can be connected to an external terminal, and a body portion to which an electronic component is mounted; a first waterproofing portion that is in intimate contact with a portion to be waterproofed located between the body portion and the terminal portion of the circuit section, and that includes a resin containing an adhesive component; and a second waterproofing portion that is in intimate contact with an outer surface of each of the circuit section and the first waterproofing portion, and that is made of a resin.

A production method of a circuit unit described in the present specification includes: a first waterproofing step of bringing a first waterproofing portion made of a resin containing an adhesive component into intimate contact with a portion to be waterproofed of a circuit section including a terminal portion that can be connected to an external terminal, and a body portion to which an electronic component is mounted, the portion to be waterproofed being located between the terminal portion and the electronic component; and a second waterproofing step of bringing a resin into intimate contact with the circuit section and the first waterproofing portion.

With this configuration, water moving along the terminal portion can be blocked by the resin of the second waterproofing portion, and is also blocked by the first waterproofing portion made of the resin containing an adhesive component. Accordingly, it is possible to inhibit entry of water from the terminal portion side to the body portion side.

The following embodiments are preferable as embodiments of the technique described in the present specification.

The circuit section includes a busbar made of a plate-shaped metal, and the terminal portion is formed on the busbar, and the first waterproofing portion and the second waterproofing portion are in intimate contact with the busbar.

With this configuration, it is possible to inhibit entry of water moving along the busbar.

The busbar has a recess having a shape formed by cutting out an outer surface thereof, and the first waterproofing portion is in intimate contact with the recess.

With this configuration, it is possible to improve the adhesion of the first waterproofing portion to the busbar. It is also possible to suppress the positional displacement of the first waterproofing portion that may be caused by the pressure applied during secondary molding.

The busbar has a through hole, and the first waterproofing portion fills the interior of the through hole.

With this configuration, it is possible to increase the strength of fixation (the suppression of the positional displacement) of the first waterproofing portion to the busbar.

The terminal portion has a width dimension larger than that of a portion of the circuit section with which the first waterproofing portion is in intimate contact.

With this configuration, it is possible to achieve waterproofing without using any gasket for a configuration in which a gasket made of rubber or the like cannot be easily mounted depending on the size of the width dimension of the terminal portion.

The busbar is bent in a crank shape at a portion thereof located between the terminal portion and the body portion. Since the busbar has a crank shape, it is possible to inhibit entry of water from the outside in a configuration for which there is concern of adhesion to the busbar during resin molding.

An electrical junction box includes: the above-described circuit unit; a heat dissipation member that is stacked on the circuit unit; and a seal member that is sandwiched between the circuit unit and the heat dissipation member.

According to the technique described in the present specification, it is possible to inhibit entry of water from the terminal portion side to the electronic component side.

DETAILED DESCRIPTION OF PREFERRED EMBODIMENTS

The present embodiment will be described with reference to FIGS. 1 to 11.

Figure 1:
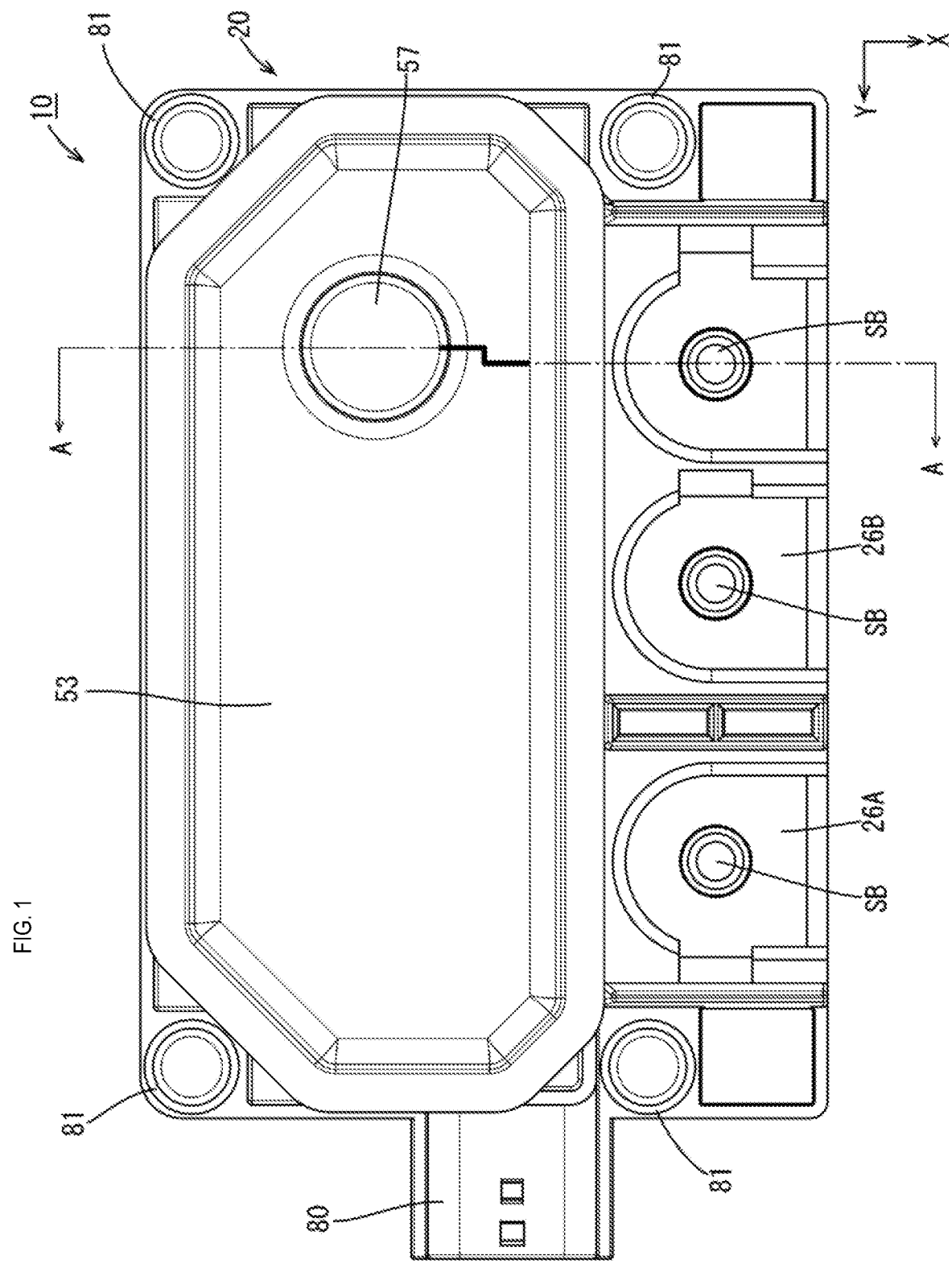
FIG. 1 is a plan view showing an electrical junction box according to an embodiment.

An electrical junction box 10 is disposed in an electricity supply path between a power supply such as a battery of a vehicle, including, for example, an electric automobile, a hybrid automobile, and a gasoline-fueled automobile, and a load including a vehicle-mounted electric/electronic component such as a lamp or a drive motor or the like. Although the electrical junction box 10 can be disposed in any orientation, the following description will be given, assuming that the X direction and the Y direction in FIG. 1 are the front direction and the left direction, and the Z direction in FIG. 2 is the upper direction.

Figure 2:
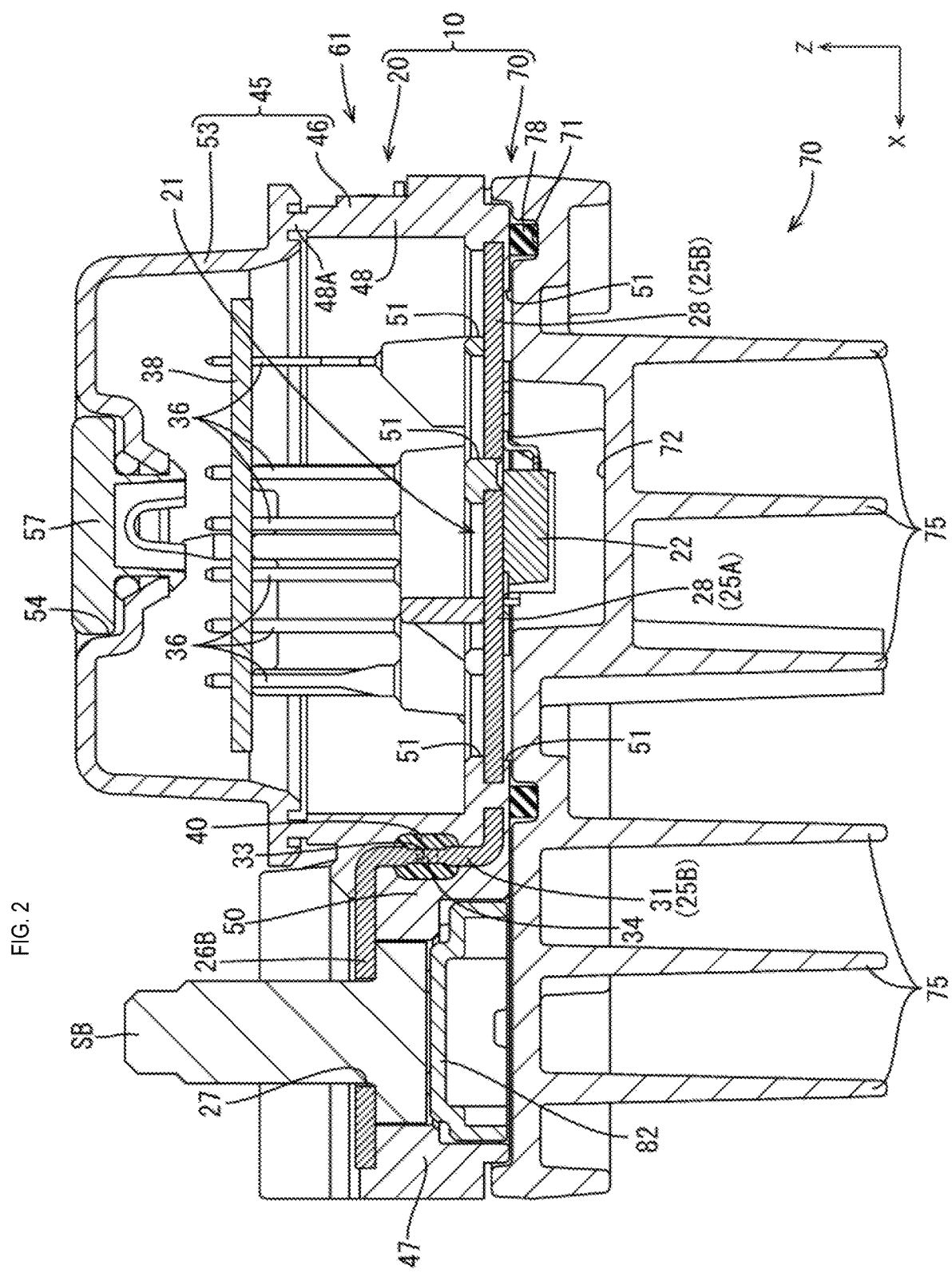
FIG. 2 is a cross-sectional view taken along the line A-A in FIG. 1.

As shown in FIG. 2, the electrical junction box 10 includes a circuit unit 20, a heat dissipation member 70 that is stacked below the circuit unit 20 and that dissipates the heat of the circuit unit 20. The circuit unit 20 includes a circuit section 21 formed by mounting electronic components 22 to busbars 25A and 25B, a first waterproofing portion 40 that is in intimate contact (here, "intimate contact" may mean areal contact, for example) with a portion to be waterproofed 34 of each of the busbars 25A and 25B, and that is made of a resin containing an adhesive component, and a resin portion 45 that is in intimate contact with the busbars 25A and 25B and the first waterproofing portions 40, and that forms a case of the circuit unit 20.

The circuit section 21 includes a plurality of electronic components 22 that generate heat when current flows through them, and a pair of (a plurality of) busbars 25A and 25B. In the present embodiment, the electronic components 22 are mounted from left to right on the back surface side of the busbars 25A and 25B, and may be, for example, relays such as field effect transistors (FETs). Note that the electronic components 22 are not limited to relays, and may be resistors, coils, or capacitors, for example. Each electronic component 22 includes a plurality of lead terminals that are to be connected to the busbar 25A or 25B. One lead terminal is provided in a region on the upper surface of each electronic component 22, and is soldered to a busbar 25A, the other plurality of lead terminals protrude from a side surface of the electronic component 22, and are soldered to a busbar 25B.

Figure 3:
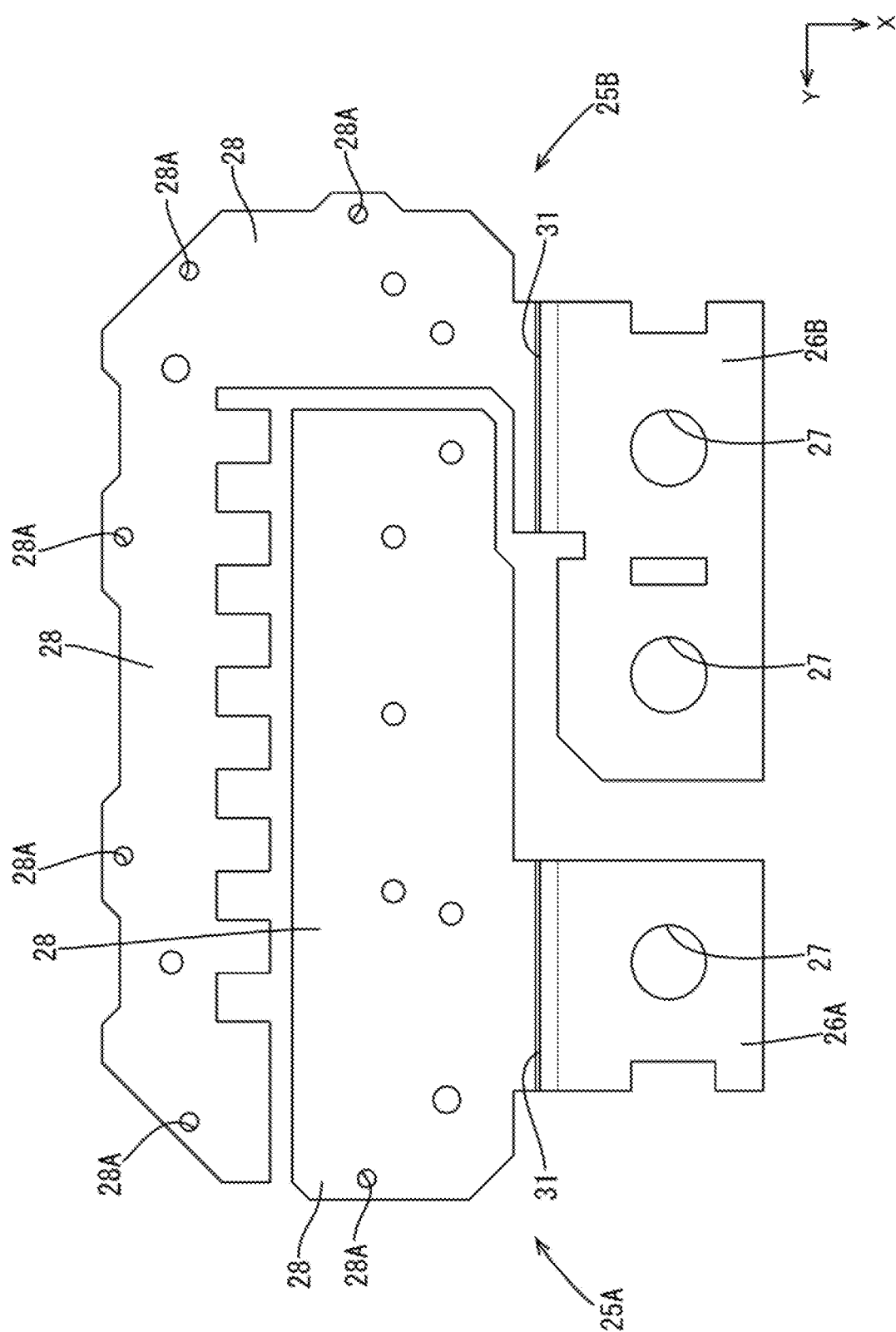
FIG. 3 is a plan view showing busbars.
Figure 4:
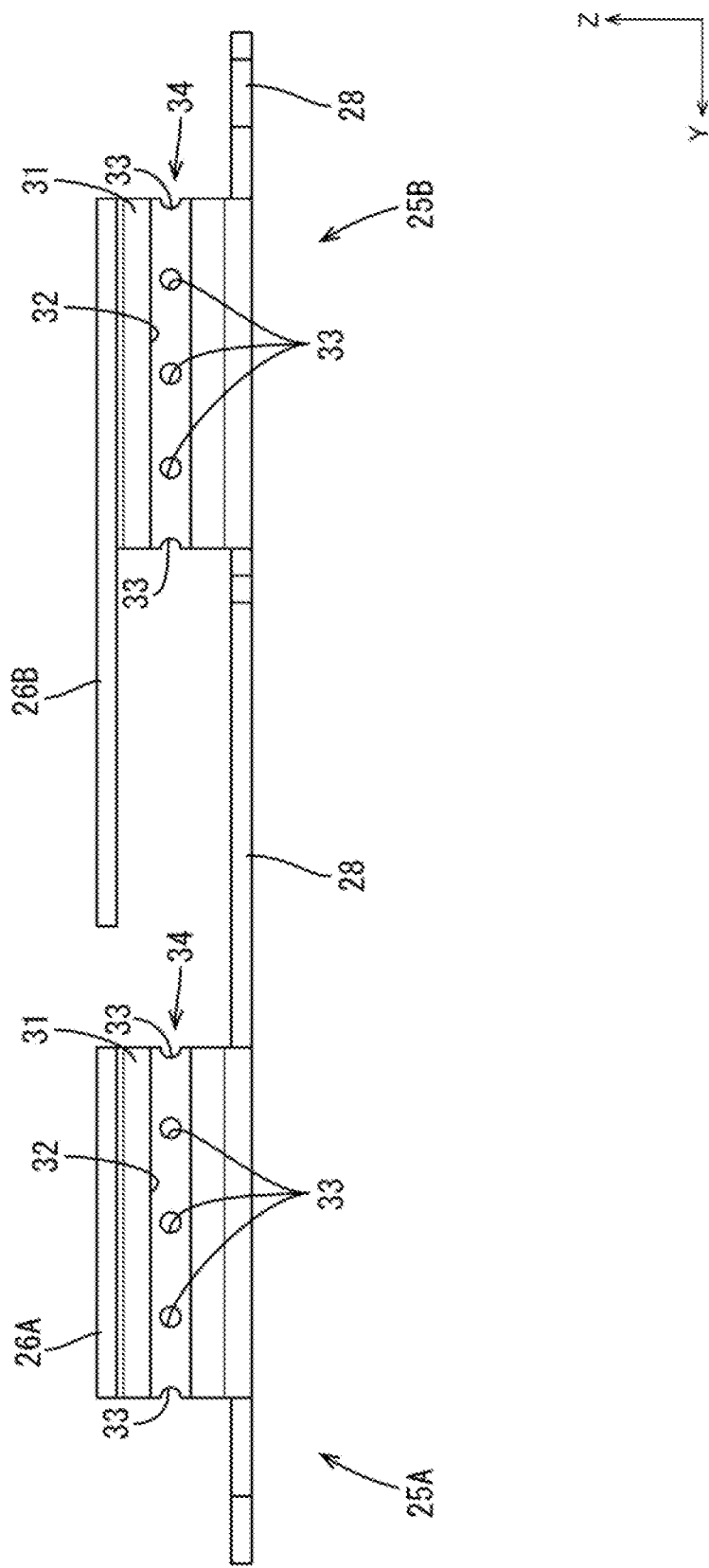
FIG. 4 is a front view showing the busbars.
Figure 5:
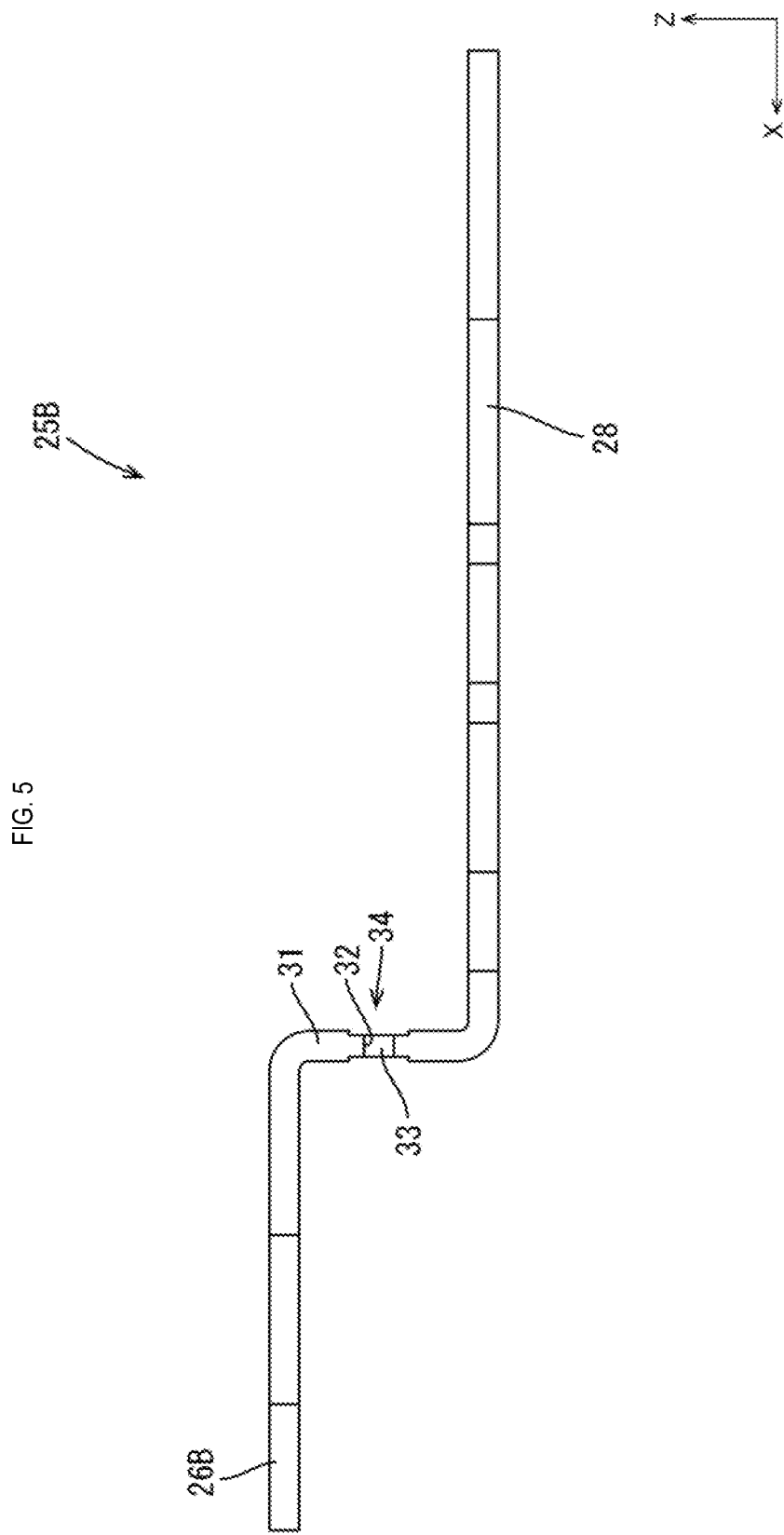
FIG. 5 is a right side view showing the busbars.
Figure 6:
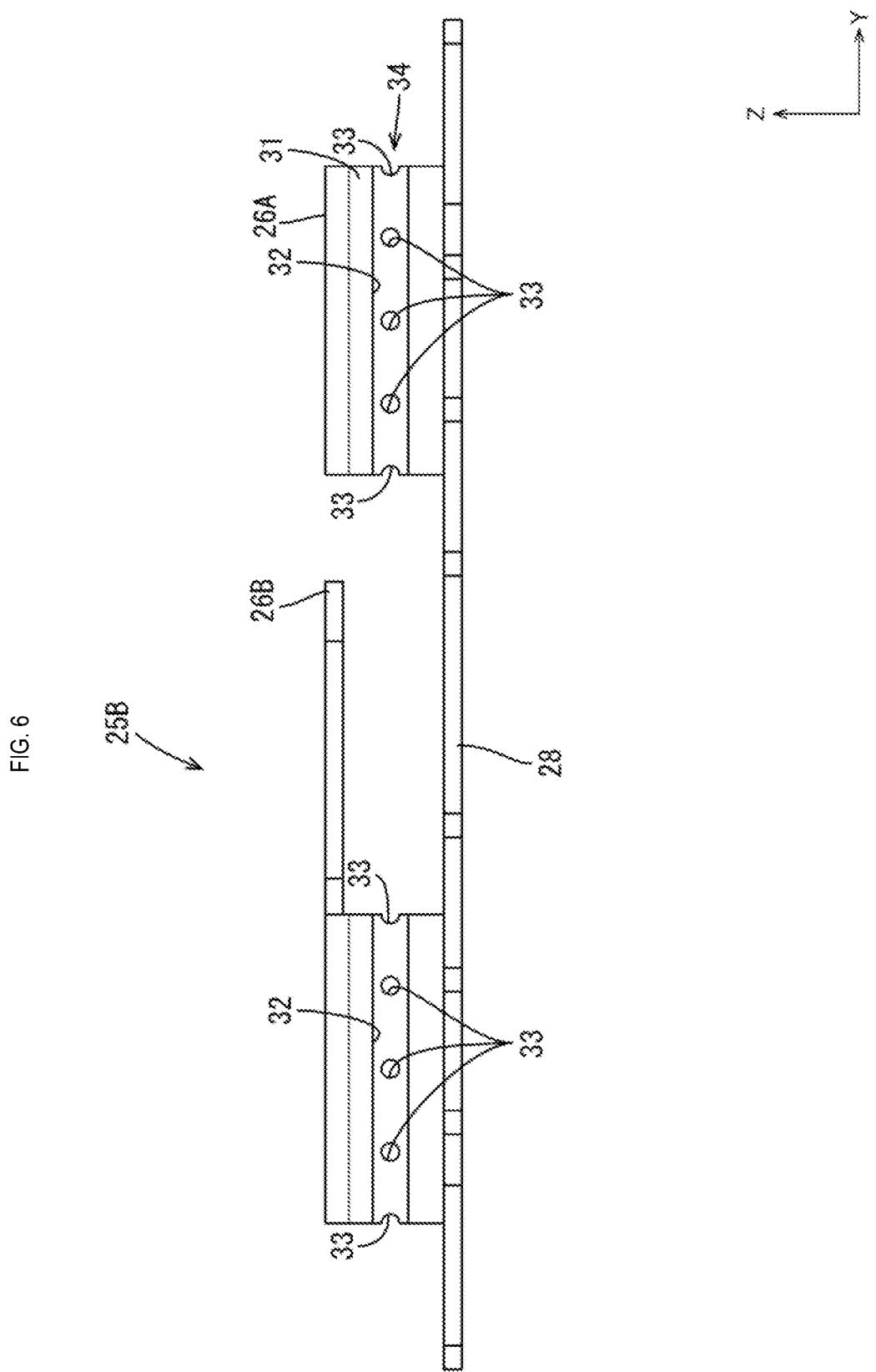
FIG. 6 is a rear view showing the busbars.

Each of the busbars 25A and 25B is made of a flat metal plate material of copper, a copper alloy or the like, is shaped in accordance with a current path as shown in FIGS. 3 and 4, and has a plated outer surface, for example. The pair of busbars 25A and 25B are disposed with a gap therebetween, and include terminal portions 26A and 26B that can both be connected to external terminals, body portions 28 to which the electronic components 22 are to be mounted, and coupling portions 31 that couple the terminal portions 26A and 26B to the respective body portions 28 in a crank shape (when viewed from the side).

The terminal portions 26A and 26B have a rectangular shape, and bolt insertion holes 27 through which the shaft portions of stud bolts SB are inserted are formed through the terminal portions 26A and 26B. One terminal portion 26B has a width dimension that is larger than the width dimension of the coupling portion 31. A lead terminal of each electronic component 22 is soldered to the body portion 28 of the busbar 25A, and the other lead terminals of the electronic component 22 are soldered to the body portion 28 of the busbar 25B. A plurality of circular holes 28A extending through each body portion 28 are disposed at the peripheral edge portion of the body portion 28 with an interval therebetween. The holes 28A can be filled with the resin of the resin portion 45, for example.

Each coupling portion 31 has a plate surface that is oriented orthogonal the terminal portion 26A or 26B and the body portion 28, and the intermediate portion of the coupling portion 31 in the up-down direction (the direction of the current flow) is a portion to be waterproofed 34, as shown in FIG. 4. The portion to be waterproofed 34 is a region with which the first waterproofing portion 40 is in intimate contact, and a groove-shaped recess 32 is provided on the entire circumference of the coupling portion 31. A plurality of circular through holes 33 extending through the recess 32 are formed in the bottom surface of the recess 32. Each of the through holes 33 is filled with the resin that forms the first waterproofing portion 40 during primary molding.

As shown in FIG. 2, on the upper side of the busbars 25A and 25B, a control circuit board 38 is disposed facing the busbars 25A and 25B. The control circuit board 38 is a printed circuit board formed by forming a conductive path (not shown) made of a copper foil or the like on an insulating plate made of an insulating material by a printed wiring technique. The control circuit board 38 is electrically connected to the busbars 25A and 25B via bar-shaped relay terminals 36. For example, the relay terminals 36 are inserted through and soldered to through holes of the control circuit board 38 and the busbars 25A and 25B. The busbars 25A and 25B each have a thickness dimension (a cross-sectional area) larger than that of the relay terminals 36. Increasing the thickness dimension (and the cross-sectional area) of the busbars 25A and 25B increases the thermal conductivity and reduces the electrical resistance, and the heat generated from the electronic components 22 is diffused in the busbars 25A and 25B and is thus made uniform. In addition, the busbars 25A and 25B are connected to a connector terminal of a connector 80 (see FIG. 1) through soldering or the like.

The first waterproofing portion 40 functions as an interface waterproofing material that waterproofs the interface between itself and the busbars 25A and 25B, and includes a polyester elastomer resin as a main component, and contains an adhesive component. The polyester elastomer resin includes a reactive group that is bonded to a metal oxide film, has properties of both rubber and engineering plastic, and is excellent, for example, in flexibility, heat resistance, and heat sealability with hard resin. As the adhesive component, it is possible to use, for example, a silicone adhesive, an epoxy adhesive, a polyurethane adhesive, a polyester adhesive, a cyanoacrylate adhesive, an acrylic adhesive, or the like.

The resin portion 45 can be made of, for example, various resin materials such as polyphenylenesulfide (PPS), polybutylene terephthalate (PBT), nylon, polypropylene (PP), and polyethylene (PE), and does not contain an adhesive component. Note that the resin material of the resin portion 45 may contain a filler such as glass fiber. As shown in FIG. 2, the resin portion 45 includes a resin body 46 and a resin cover 53 that covers an opening portion 48A of the resin body 46. The resin body 46 includes a second waterproofing portion 50 that is in intimate contact with the outer surfaces of the first waterproofing portions 40 and the regions of the busbars 25A and 25B other than the portions to be waterproofed 34, a peripheral wall portion 48 that has a rectangular tube shape and surrounds the regions of the body portions 28 of the busbars 25A and 25B, and a bolt holding portion 47 that holds the head portions of the stud bolts SB.

The second waterproofing portion 50 is formed as a single piece with the peripheral wall portion 48 and the bolt holding portion 47, extends along the plate surfaces of the busbars 25A and 25B, and is in intimate contact with the outer surfaces of the busbars 25A and 25B and the outer surfaces of the first waterproofing portions 40. A plurality of exposure holes 51 through which the upper surfaces and the lower surfaces of the body portions 28 are partially exposed are formed in the second waterproofing portion 50 at positions overlapping the body portions 28 of the busbars 25A and 25B.

The busbars 25A and 25B are fixed to the bolt holding portion 47, and the terminal portions 26A and 26B are exposed on the bolt holding portion 47. In a state in which the shaft portions of the stud bolts SB are inserted through the bolt insertion holes 27, the stud bolts SB are held by the bolt holding portion 47, together with the terminal block 82, and the terminal portions 26A and 26B are fastened to external terminals (not shown) with nuts (not shown).

The resin cover 53 is joined to the upper end opening portion 48A of the peripheral wall portion 48 through heat sealing. As a result of heat sealing the resin cover 53, the internal space of the peripheral wall portion 48 is brought into a sealed state and is thus waterproofed. An attachment hole 54 to which a vent valve 57 is mounted is formed through the resin cover 53. The vent valve 57 includes a vent membrane that allows passage of air and prevents passage of water, and micropores having waterproofness, dustproofness, and air permeability are formed in the vent valve 57.

Figure 10:
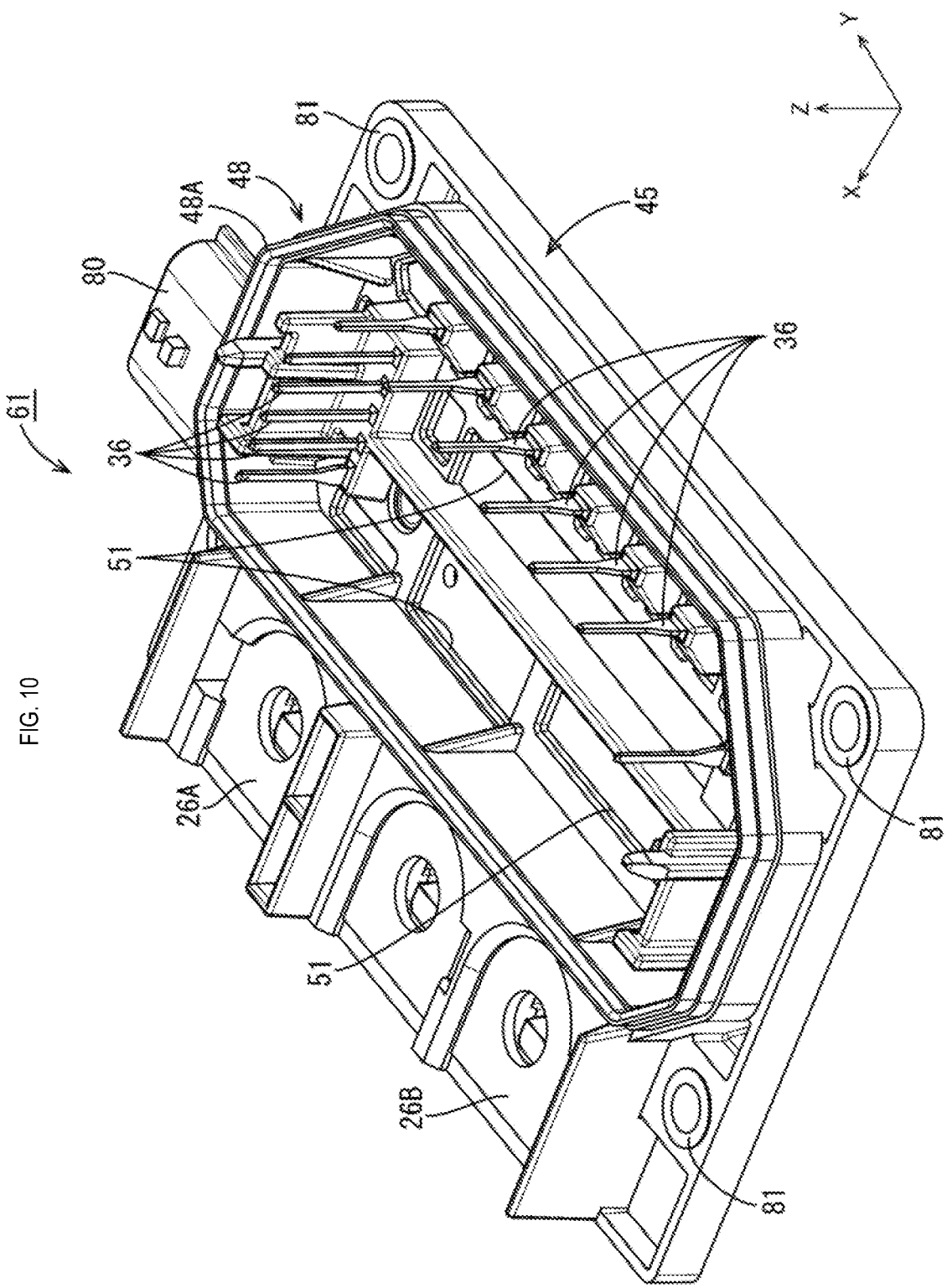
FIG. 10 is a perspective view showing a secondary molded article.
Figure 11:
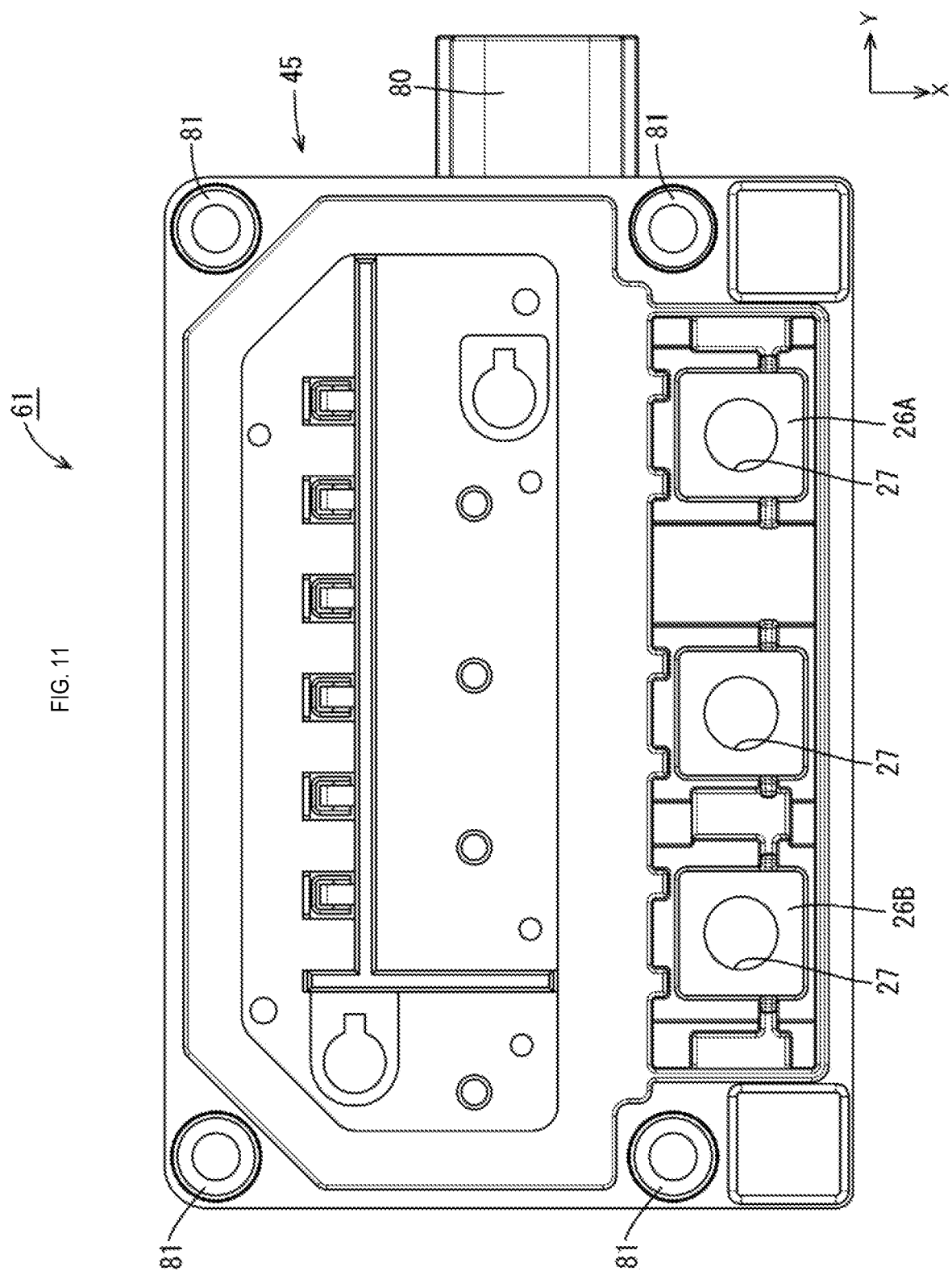
FIG. 11 is a bottom view showing the secondary molded article.

As shown in FIG. 10, fastening portions 81 for fixing the resin body 46 to the heat dissipation member 70 through fastening with screws (not shown) are fixed to the resin body 46 at four corner positions of the resin body 46. Each fastening portion 81 is formed, for example, by a cylindrical metal collar through which the shaft portion of a screw is inserted, and is embedded in the resin body 46.

As shown in FIG. 2, the heat dissipation member 70 is made of a metal material having high thermal conductivity, such as aluminum, an aluminum alloy, copper, or a copper alloy, and a plurality of heat dissipation fins 75 are aligned on the lower surface side. A seal member accommodating groove 71 into which a seal member 78 is fitted, and accommodating recesses 72 in which the electronic components 22 are accommodated are formed on the upper surface of the heat dissipation member 70. The seal member accommodating groove 71 extends in an annular shape surrounding the body portions 28. A heat transfer material (not shown) is disposed between the upper surface of the heat dissipation member 70 and the lower surface of the circuit unit 20. As the heat transfer material, synthetic resin or the like having insulating properties and high thermal conductivity can be used. For example, it is possible to use a heat-dissipating adhesive made of epoxy resin or the like.

A production method of the electrical junction box 10 will be described next.

Figure 7:
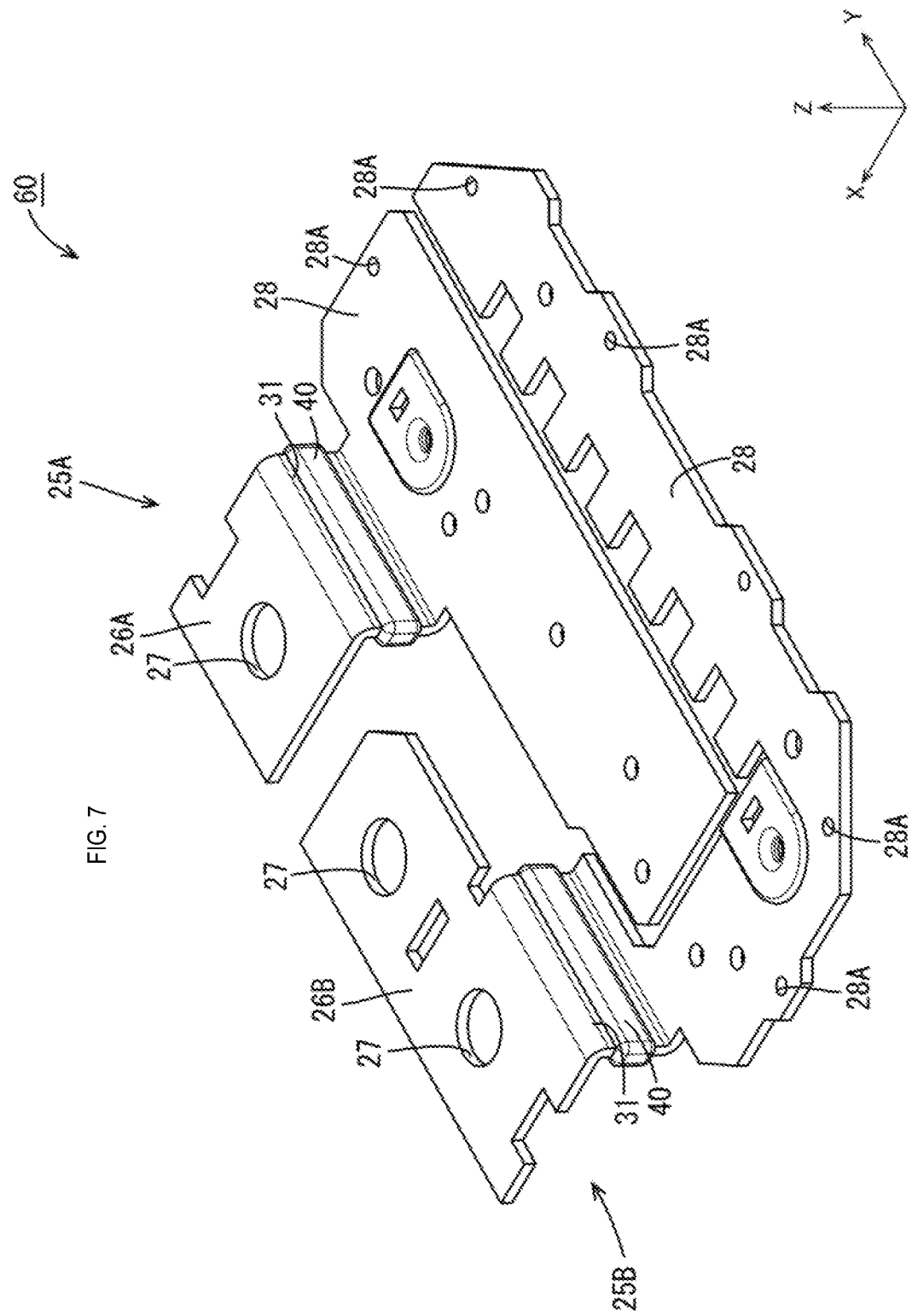
FIG. 7 is a perspective view showing a primary molded article in which a first waterproofing portion is formed on each busbar.
Figure 8:
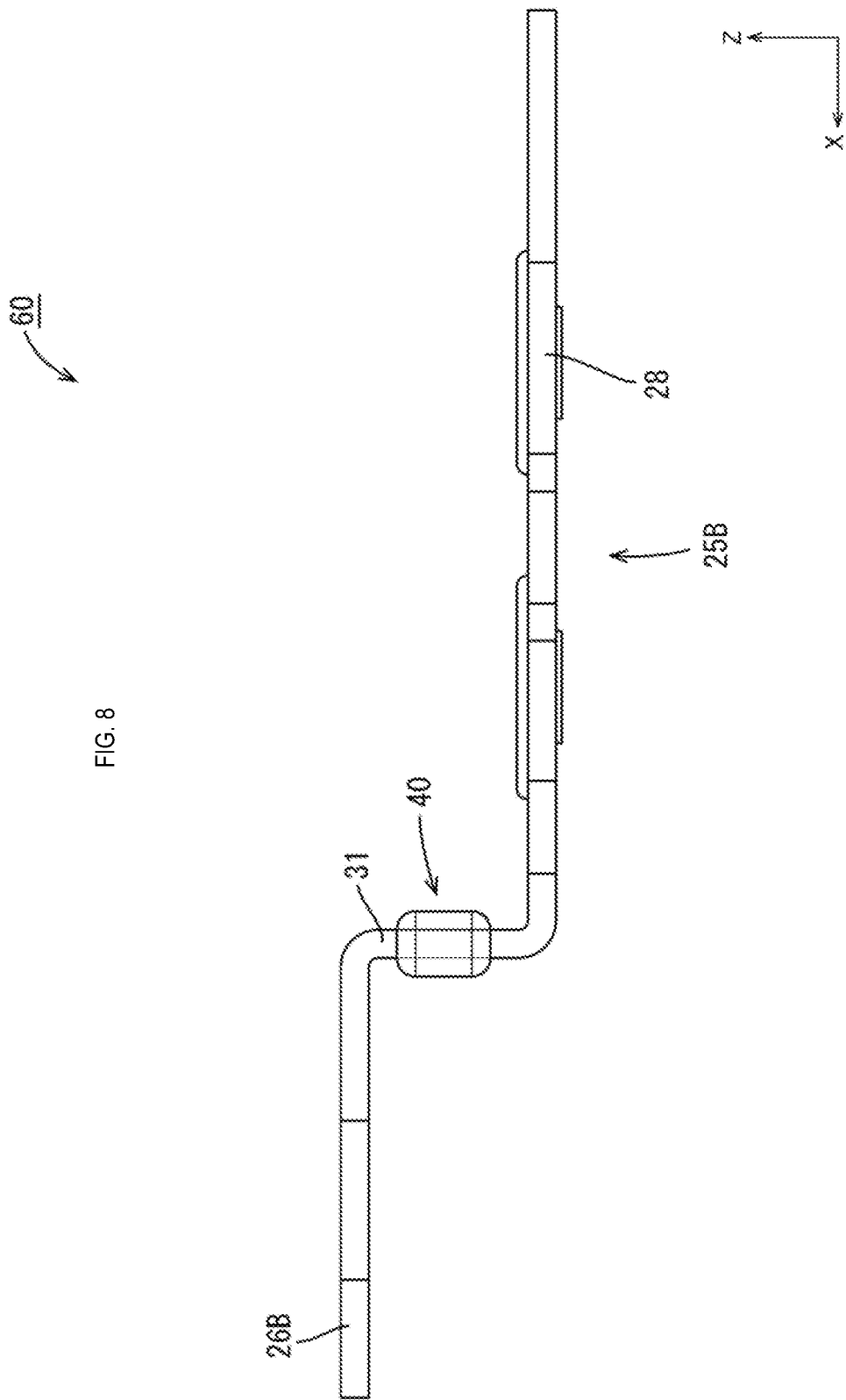
FIG. 8 is a right side view of the primary molded article in which a first waterproofing portion is formed on each busbar.
Figure 9:
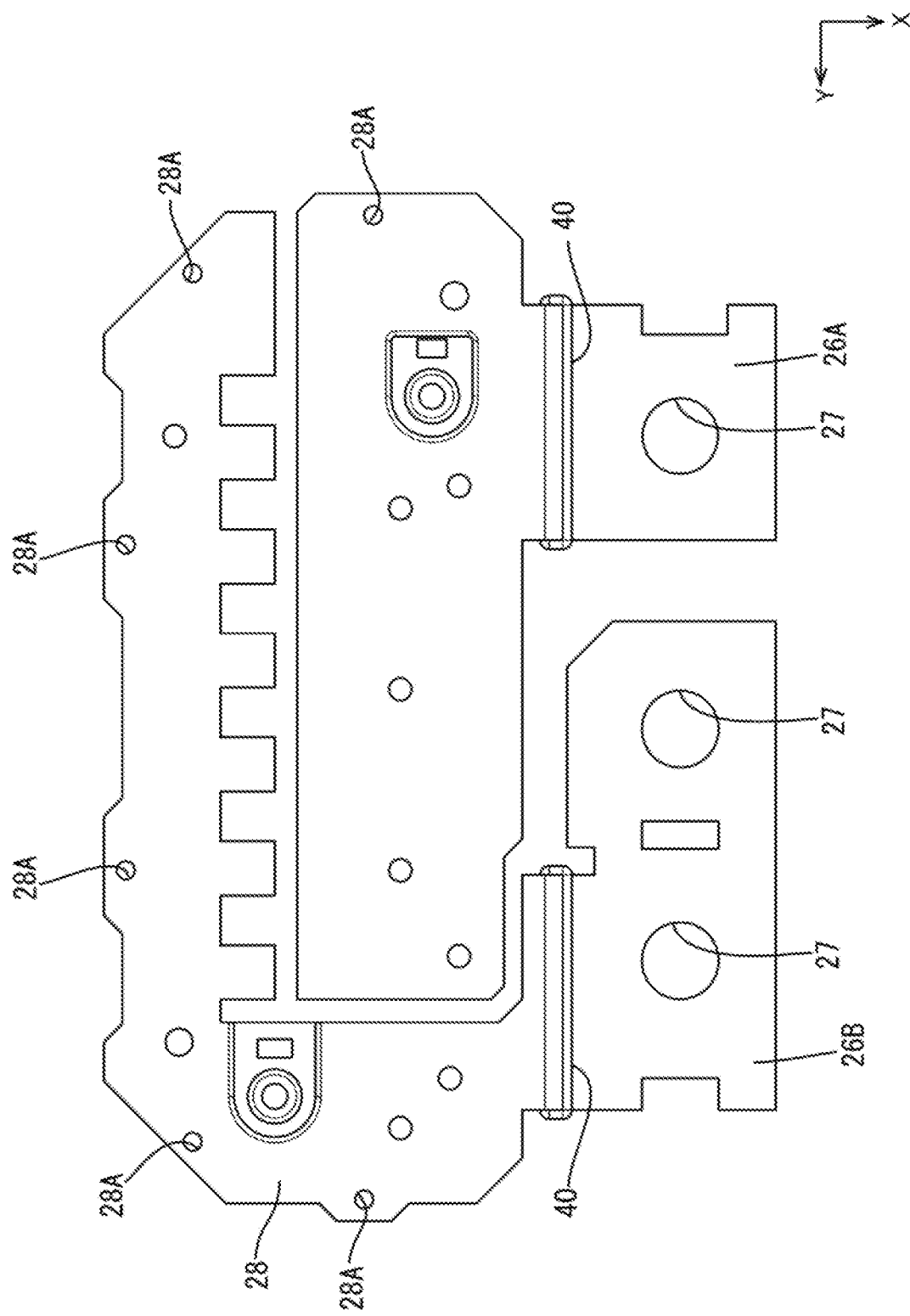
FIG. 9 is a bottom view showing the primary molded article in which a first waterproofing portion is formed on each busbar.

After forming a plurality of busbars 25A and 25B (FIG. 3) by subjecting a metal plate material to punching and bending using a pressing machine, a first waterproofing step is performed. In the first waterproofing step, the busbars 25A and 25B are placed inside a mold (not shown), and a liquid polyester elastomer resin containing an adhesive component is injected into the mold. After the polyester elastomer resin has been solidified, the busbars 25A and 25B are removed from the mold. Thus, a primary molded article 60 in which first waterproofing portions 40 are formed on the busbars 25A and 25B is formed (FIG. 7).

Next, a second waterproofing step is performed for the primary molded article 60. In the second waterproofing step, the primary molded article 60 and relay terminals 36 are placed inside a mold (not shown), and insert molding in which a liquid synthetic resin is injected into the mold is performed, thus forming a secondary molded article 61 (FIG. 10).

The actions and effects of the present embodiment will be described next.

A circuit unit 20 includes: a circuit section 21 including a terminal portion 26A, 26B that can be connected to an external terminal, and a body portion 28 to which an electronic component 22 is mounted; a first waterproofing portion 40 that is in intimate contact with the portion to be waterproofed 34 located between the body portion 28 and the terminal portion 26A, 26B of the circuit section 21, and that includes a resin containing an adhesive component; and a second waterproofing portion 50 that is in intimate contact with an outer surface of each of the circuit section 21 and the first waterproofing portion 40, and that is made of a resin.

According to the present embodiment, water moving along the terminal portion 26A, 26B can be blocked by the resin of the second waterproofing portion 50, and is also blocked by the first waterproofing portion 40 made of the resin containing an adhesive component. Accordingly, it is possible to inhibit entry of water from the terminal portion 26A, 26B side to the body portion 28 side.

The circuit section 21 includes a busbar 25A, 25B made of a plate-shaped metal, and the terminal portion 26A, 26B is formed on the busbar 25A, 25B, and the first waterproofing portion 40 and the second waterproofing portion 50 are in intimate contact with the busbar 25A, 25B.

With this configuration, it is possible to inhibit entry of water for the busbar 25A, 25B through which a relatively large amount of current flows.

The busbar 25A, 25B has a recess 32 having a shape formed by cutting out an outer surface thereof, and the first waterproofing portion 40 is in intimate contact with the recess 32.

With this configuration, it is possible to improve the adhesion of the first waterproofing portion 40 to the busbar 25A, 25B. It is also possible to suppress the positional displacement of the first waterproofing portion 40 that may be caused by the pressure applied during secondary molding.

The busbar 25A, 25B has a through hole 33, and the first waterproofing portion 40 fills the interior of the through hole 33.

With this configuration, it is possible to increase the strength of fixation (the suppression of the positional displacement) of the first waterproofing portion 40 to the busbar 25A, 25B.

The terminal portion 26A, 26B has a width dimension larger than that of a portion to be waterproofed 34 of the circuit section 21 with which the first waterproofing portion 40 is in intimate contact.

With this configuration, it is possible to achieve waterproofing without using any gasket for a configuration in which a gasket made of rubber or the like cannot be easily mounted depending on the size of the width dimension of the terminal portion 26A, 26B.

The busbar 25A, 25B is bent in a crank shape at a coupling portion 31 located between the terminal portion 26A, 26B and the body portion 28.

With this configuration, the busbar 25A, 25B has a crank shape, and it is therefore possible to inhibit entry of water from the outside in a configuration for which there is concern of adhesion to the busbar 25A, 25B during resin molding.

Other Embodiments

The technique described in the present specification is not limited to the embodiments described and illustrated above. For example, the following embodiments also fall within the technical scope of the technique described in the present specification.

Although the first waterproofing portion 40 is a polyester elastomer resin containing an adhesive component, the technique described in the present specification is not limited thereto, and an adhesive component may be contained in a different resin.

A printed circuit board formed by printing a conductive path made of a copper foil or the like on an insulating plate may be stacked on the busbar 25A, 25B, thus forming a circuit section.

Although the coupling portion 31 extends in a direction orthogonal to the terminal portion 26A, 26B and the body portion 28, the technique described in the present specification is not limited thereto, and it is possible to adopt a configuration including a coupling portion that extends along a direction intersecting the terminal portion 26A, 26B and the body portion 28.

What is claimed is:

1. A circuit unit comprising:
   a circuit section including a terminal portion that can be connected to an external terminal, the circuit section having a waterproofed portion, and a body portion to which an electronic component is mounted, the waterproofed portion extending between the terminal portion and the body portion and being orthogonal to both the terminal portion and the body portion;
   a first waterproofing portion disposed on a first and a second side of the waterproofed portion, and that includes a resin containing an adhesive component; and
   a second waterproofing portion that is in intimate contact with an outer surface of each of the body portion and the first waterproofing portion, and that is made of a resin.

2. The circuit unit according to claim 1,
   wherein the circuit section includes a busbar made of a plate-shaped metal, and
   the terminal portion is formed on the busbar, and the first waterproofing portion and the second waterproofing portion are in intimate contact with the busbar.

3. The circuit unit according to claim 2,
   wherein the busbar has a recess having a shape formed by cutting out an outer surface thereof, and
   the first waterproofing portion is in intimate contact with the recess.

4. The circuit unit according to claim 2, wherein the busbar has a through hole, and the first waterproofing portion fills the interior of the through hole.

5. The circuit unit according to claim 2, wherein the terminal portion has a width dimension that is larger than that of a portion of the circuit section with which the first waterproofing portion is in intimate contact.

6. The circuit unit according to claim 2, wherein the busbar is bent in a crank shape at a portion thereof located between the terminal portion and the body portion.

7. An electrical junction box comprising:
   the circuit unit according to claim 1;
   a heat dissipation member that is stacked on the circuit unit; and
   a seal member that is sandwiched between the circuit unit and the heat dissipation member.

8. A production method of a circuit unit, comprising:
   a first waterproofing step of bringing a first waterproofing portion made of a resin containing an adhesive component into contact with a first side and a second side of a waterproofed portion of a circuit section including a terminal portion that can be connected to an external terminal, and a body portion to which an electronic component is mounted, the waterproofed being located between the terminal portion and the electronic component and being orthogonal to both the terminal portion and the body portion; and
   a second waterproofing step of bringing a resin into intimate contact with the body portion of the circuit section and the first waterproofing portion.

9. The circuit unit according to claim 3, wherein the busbar has a through hole, and the first waterproofing portion fills the interior of the through hole.

10. The circuit unit according to claim 3, wherein the terminal portion has a width dimension that is larger than that of a portion of the circuit section with which the first waterproofing portion is in intimate contact.

11. The circuit unit according to claim 4, wherein the terminal portion has a width dimension that is larger than that of a portion of the circuit section with which the first waterproofing portion is in intimate contact.

12. The circuit unit according to claim 3, wherein the busbar is bent in a crank shape at a portion thereof located between the terminal portion and the body portion.

13. The circuit unit according to claim 4, wherein the busbar is bent in a crank shape at a portion thereof located between the terminal portion and the body portion.

14. The circuit unit according to claim 5, wherein the busbar is bent in a crank shape at a portion thereof located between the terminal portion and the body portion.

* * * * *